United States Patent [19]
Gurkovich et al.

[11] Patent Number: 5,757,611
[45] Date of Patent: May 26, 1998

[54] ELECTRONIC PACKAGE HAVING BURIED PASSIVE COMPONENTS

[75] Inventors: Stephen R. Gurkovich, Pittsburgh; Theodore R. Vasilow, Irwin, both of Pa.; Andrew J. Piloto, Columbia, Md.; Deborah P. Partlow, Export; Kenneth C. Radford, North Huntingdon, both of Pa.; Alex E. Bailey, Hampstead, Md.

[73] Assignee: Norhtrop Grumman Corporation, Los Angeles, Calif.

[21] Appl. No.: 631,397

[22] Filed: Apr. 12, 1996

[51] Int. Cl.$^6$ .................................................. H01G 4/06
[52] U.S. Cl. ................................. 361/321.4; 361/321.5; 361/321.3; 361/306.1; 156/89
[58] Field of Search .......................... 361/321.4, 306.1, 361/301.3, 301.4, 312, 313, 321.5; 333/238, 246, 247; 156/89; 363/147; 428/210

[56] References Cited

U.S. PATENT DOCUMENTS

| | | | |
|---|---|---|---|
| 4,899,118 | 2/1990 | Polinski, Sr. et al. | 333/246 |
| 5,144,526 | 9/1992 | Vu et al. | 361/321.1 |
| 5,312,674 | 5/1994 | Haertling et al. | 428/210 |
| 5,318,820 | 6/1994 | Smith et al. | 428/210 |
| 5,378,662 | 1/1995 | Tsuyuki | 501/17 |
| 5,384,434 | 1/1995 | Mandai et al. | 174/258 |
| 5,400,210 | 3/1995 | Sugimoto et al. | 361/321.5 |
| 5,415,945 | 5/1995 | Azumi et al. | 428/692 |
| 5,604,673 | 2/1997 | Washburn et al. | 363/147 |

OTHER PUBLICATIONS

"Stabilization of the Perovskite Phase and Dielectric Properties in the Pb(Mg$_{1/3}$Nb$_{2/3}$O$_3$–BaTio$_3$ System" by Dong Heon Kang and Ki Hyun Yoon, 1991 Chapman and Hall.

Technical Notes #10, Multilayer Ceramic Substrate with Inner Capacitors Proceedings from the International Materials Conference, Jun. 3–5, 1992 by Yoshiro Fujioka et al., Kyocera Corporation, Kagoshima, Japan.

"Monolithic Multicomponents Ceramic (MMC) Substrate" by Kazuaki Utsiumi, Uyzo Shimada, Teruyuki Ikeda and Hideo Takamizawa, *Ferroelectrics*, vol. 68, pp. 157–179.

*Primary Examiner*—Leo P. Picard
*Assistant Examiner*—Anthony Dinkins
*Attorney, Agent, or Firm*—Walter G. Sutcliff

[57] ABSTRACT

The invention provides for an electronic package having a buried passive component such as a capacitor therein, and a method for fabricating the same. The electronic package preferably includes a passive component portion which includes a plurality of layers of high K dielectric material, a signal processing portion which includes a plurality of layers of low K dielectric material, and at least one buffer layer interposed between the passive component portion and the signal processing portion. Metallization is preferably printed upon at least one of the layers of high K dielectric material and at least one of the layers of low K dielectric material. Preferably, the layers are co-fired at a temperature below approximately 1200° C. to form the electronic package and each of the buffer layers contains approximately 25 to 100% barium compound. Via conductors may also be provided through the buffer layers to electrically couple the passive component portion and the signal processing portion and the metallization and the via conductors may be selected from highly conductive materials such as gold, silver, copper and alloys thereof.

33 Claims, 4 Drawing Sheets

ELECTRONIC PACKAGE HAVING BURIED PASSIVE COMPONENTS

BACKGROUND OF THE INVENTION

1. Field of the Invention

The present invention relates to low temperature co-fired ceramic electronic devices, and more particularly to low temperature co-fired ceramic electronic devices having passive components formed within the device.

2. Description of the Related Art

Due to numerous improvements in semiconductor device technology, electronic signal processing may now be accomplished with smaller integrated circuits in a minimum amount of space. Many applications such as airborne, space-based and certain consumer electronics require compact electronics. As the size of the integrated circuits continues to be reduced, the need for smaller passive components is increasingly important.

Low-temperature co-fired ceramic (LTCC) substrates are customarily used in high-end digital applications such as RF/microwave packaging units. The integrated circuit devices are mountable on the surface of the ceramic substrate or in recessed cavities in the ceramic packaging unit since the commercially available ceramic packages have been developed mostly for digital applications, their dielectric properties in the microwave range are marginal. The advancement in semiconductor and supporting electronic technology has progressed to the point that, in some cases, the performance of an electronic microwave system is limited by the available packaging materials. Therefore, LTCC materials with improved microwave properties are emerging.

One method for producing such an LTCC material employs a multilayer ceramic powder produced via a sol-gel precipitation process. This powder is suitable for fabrication into ceramic electronic packages having a low dielectric constant and a very low loss tangent. The powder is able to densify at temperatures that are compatible with the use of high conductivity metallizations such as gold, silver, and copper. In particular, densification is achieved at or below 1000° C. in order to provide a margin of error sufficiently distant from the melting point of gold at 1060° C.

A borosilicate-based LTCC material produced in accordance with such a method has a low dielectric constant of approximately 3.8–4.0 and a low loss tangent below $1 \times 10^{-3}$. A low dielectric constant within the signal processing portion is preferred to improve the speed at which the signals therein are propagated to provide fast processing. Low loss within the signal processing portion is preferred to reduce power requirements as well as signal amplification requirements.

Passive components such as resistors and capacitors have been mounted on the surface of conventional ceramic substrates adjacent to the integrated circuits. The surface-mounted passive components may be electrically connected to the integrated circuit through wire bonds. The bulk space contributed by passive devices mounted on the surface of the substrate has become unacceptable as the demand for smaller electronic packages increases. Furthermore, the wire bonds are a major source of failure and limit system yield, lifetime and reliability.

One solution to the problem of utilizing surface mounted components is to integrate the passive components into the multilayered ceramic substrate or package structure. For example, resistors have been buried within the multilayered structures to reduce the size and improve reliability as compared with the conventional surface mounted devices. Using thick film technology, a metal oxide resistor pattern may be screen printed onto the appropriate ceramic layer while it is still in the unfired state. The ceramic at this stage is in the form of thin sheets of ceramic powder which are bonded together by organic binders such as vinyl to make ceramic tape.

Electrical connections to the printed resistors are made using metallizations applied on the ceramic tape via the screen printing technology used for applying resistors. The layers of unfired ceramic tape are subsequently stacked, laminated, and fired into a solid, dense, ceramic package. The resistor is thus "buried" within the electronic structure and electrically connected without using wire bonds. Such a device is more compact and reliable when compared with conventional packaging of integrated circuits where surface mounted components are used.

A bank of capacitors has also been fabricated as a buried component using thin layers of ceramic having suitable electrical properties with a high dielectric constant (K). Such ceramics are made into thin tape form and metal electrodes are screen printed onto each thin capacitor layer. The unfired layers of capacitor and low K dielectric are then laminated together. The entire assembly is then co-fired and densified in one high temperature firing that burns out the organics in all of the tapes and sinters the ceramic and metal layers together.

However, this conventional assembly utilizes a low dielectric constant material which contains a lead-based glass resulting in increased dielectric constant and increased losses. The increased dielectric constant and increased losses of the low dielectric constant material are not significantly impacted by the diffusion of lead from the capacitor.

An example of this type of buried capacitor bank has been fabricated with a lead iron niobate-lead iron tungstate (PFN-PFW) dielectric having a dielectric constant (K) of 7000 and which fires at 900° C. The ceramic substrate (LTCC) material in which this capacitor bank is buried, however, displays a dielectric constant of 7.5 which may be unsuitable for many applications where signal processing speed is critical and minimal attenuation of the signal is required.

The utilization of co-fired integration to form an electronic package requires that both the high K dielectric material, such as PMN, and low K dielectric material, such as borosilicate, be laminated into a monolithic unit and fired together at temperatures between 850°–1000° C. Co-fired integration is preferred to provide a single uniform electronic package and to avoid difficult alignment problems which would be faced if the capacitor bank had to be joined to the low K dielectric after each was separately fired.

Lead-based relaxor dielectrics have been utilized to provide a capacitor material which has a maximum K and fires in the range of 850°–1000° C. to meet LTCC requirements. Specifically, lead magnesium niobate (PMN) with the general formula $Pb(Mg_{0.33}Nb_{0.67})O_3$ is one system which fires in the 850°–1000° C. range and has a dielectric constant ranging from 15000–25000, depending on firing profiles and processing additives.

However, chemical reactions take place when the PMN based material and a borosilicate based material are in contact at temperatures above 800° C. during the cofiring process. Specifically, a reduction in the dielectric constant of 50% can be expected when 5% pyrochlore phase is formed from a single phase $Pb(Mg_{0.33}Nb_{0.67})O_3$ with a dielectric constant on the order of 20,000.

Excess PbO and MgO have been shown to improve the stability of the $Pb(Mg_{0.33}Nb_{0.67})O_3$ perovskite phase at lower firing temperatures (800° C.). However, the effect of the excess PbO and MgO is significantly reduced as temperatures approach 1000° C. Furthermore, excesses of PbO and MgO are undesirable in contact with the low loss and low dielectric constant borosilicate material (K=3.8, tan δ=0.0005). Increases in PbO content increase the rate at which lead diffuses into the low dielectric material, thereby increasing the dielectric constant and increasing the losses. MgO causes crystallization in the borosilicate based dielectric, which inhibits its densification.

Other methods of integration have been developed which include post fired joining of monolithic structures as shown in U.S. Pat. No. 5,384,434. However, this method of forming electronic packages requires joining of two monolithic structures within very high precision alignment, and such tolerances are difficult to meet because of shrinkage during firing. In particular, the vias within each monolithic structure must match exactly with the vias within the corresponding monolithic structure.

As alternatives to PbO and MgO, additives such as glass and $BaTiO_3$ may be utilized to meet densification or chemical compatibility requirements, respectively. However, the use of additives significantly degrades the electrical properties of the electronic package.

Buffer layers such as $CaTiO_3$ have also been utilized to provide physical separation, enhance stability in the presence of diffusing species and exhibit similar densification characteristics to the high K dielectric and low K dielectric. These buffer layers have intermediate dielectric constants which could also be incorporated into a passive device network.

In particular, a component having a $Mg_2SiO_4$ low K dielectric, a $CaTiO_3$ buffer having a dielectric constant of 110, and a $BaTiO_3$ capacitor portion having a dielectric constant of 2000 has been fabricated. However, this component requires a firing temperature of approximately 1250°–1300° C. which is too high for low loss ceramic tapes and the low resistivity metallization patterns therein. Furthermore, this system also has a thermal coefficient of expansion of $12 \times 10^{-6}$ ppm/°C. which is not suitable for Si and GaAs based semiconductor chips.

In particular, silicon thermal expansion is approximately $4 \times 10^{-6}$ ppm/°C. and GaAs is approximately $6.5 \times 10^{-6}$ ppm/°C. If chips are mounted on a ceramic base with a different thermal expansion, the delicate chip will break upon cooling from the soldering process used for chip mounting or it may break when the electronic system is subjected to thermal excursions.

Therefore, there is a need for a monolithic structure having a high K dielectric and a low K dielectric which may be formed by co-fired integration.

SUMMARY OF THE INVENTION

The invention provides for an electronic package having a buried passive component such as a capacitor. The electronic package preferably includes a passive component portion which includes a plurality of layers of high K dielectric material and a signal processing portion which includes a plurality of layers of low K dielectric material. The high K dielectric material is preferably lead based and may include $Pb(Mg_{0.33}Nb_{0.67})O_3$ in particular. Further, the low K dielectric material preferably includes borosilicate.

The electronic package further includes at least one buffer layer interposed between the passive component portion and the signal processing portion and metallization printed upon at least one of the layers of high K dielectric material and at least one of the layers of low K dielectric material.

The layers of high K dielectric material and the layers of low K dielectric material and at least one buffer layer are co-fired at a temperature below approximately 1200° C., preferably less than 1000° C., to form the electronic package. Each of the buffer layers contains approximately 25 to 100% of barium compound preferably selected from the group consisting of BaO, $BaCO_3$, and $BaTiO_3$ and combinations thereof.

The electronic package may further include via conductors through the buffer layers to electrically couple the passive component portion and the signal processing portion. The metallization and the via conductors may be selected from the group consisting of gold, silver, palladium, copper and alloys thereof. The metallization may include a plurality of opposing electrodes within the passive component portion to form a capacitor.

The invention further provides for a method of fabricating integrated electrical packages. The method preferably includes the steps of providing layers of high K dielectric material, layers of low K dielectric material in a spatial relation to the layers of high K dielectric material and at least one buffer layer interposed between the layers of high K dielectric material and the layers of low K dielectric material. The method also includes the steps of applying metallization to at least one of the layers of high K dielectric material and at least one of the layers of low K dielectric material and co-firing the layers at temperatures below approximately 1200° C., but preferably less than 1000° C., to remove organics therein and form the electronic package.

The method in accordance with the present invention may further include punching the high K dielectric layers and the low K dielectric layers and the at least one buffer layer to form a plurality of vias therein and providing via conductors within the vias.

The method may additionally include stacking the high K dielectric layers and the low K dielectric layers and the at least one buffer layer and laminating the high K dielectric layers and the low K dielectric layers and the at least one buffer layer. The layers may be laminated at a pressure of approximately 3000 PSI at approximately 120° F.

DESCRIPTION OF THE PREFERRED EMBODIMENTS

Figure 1:
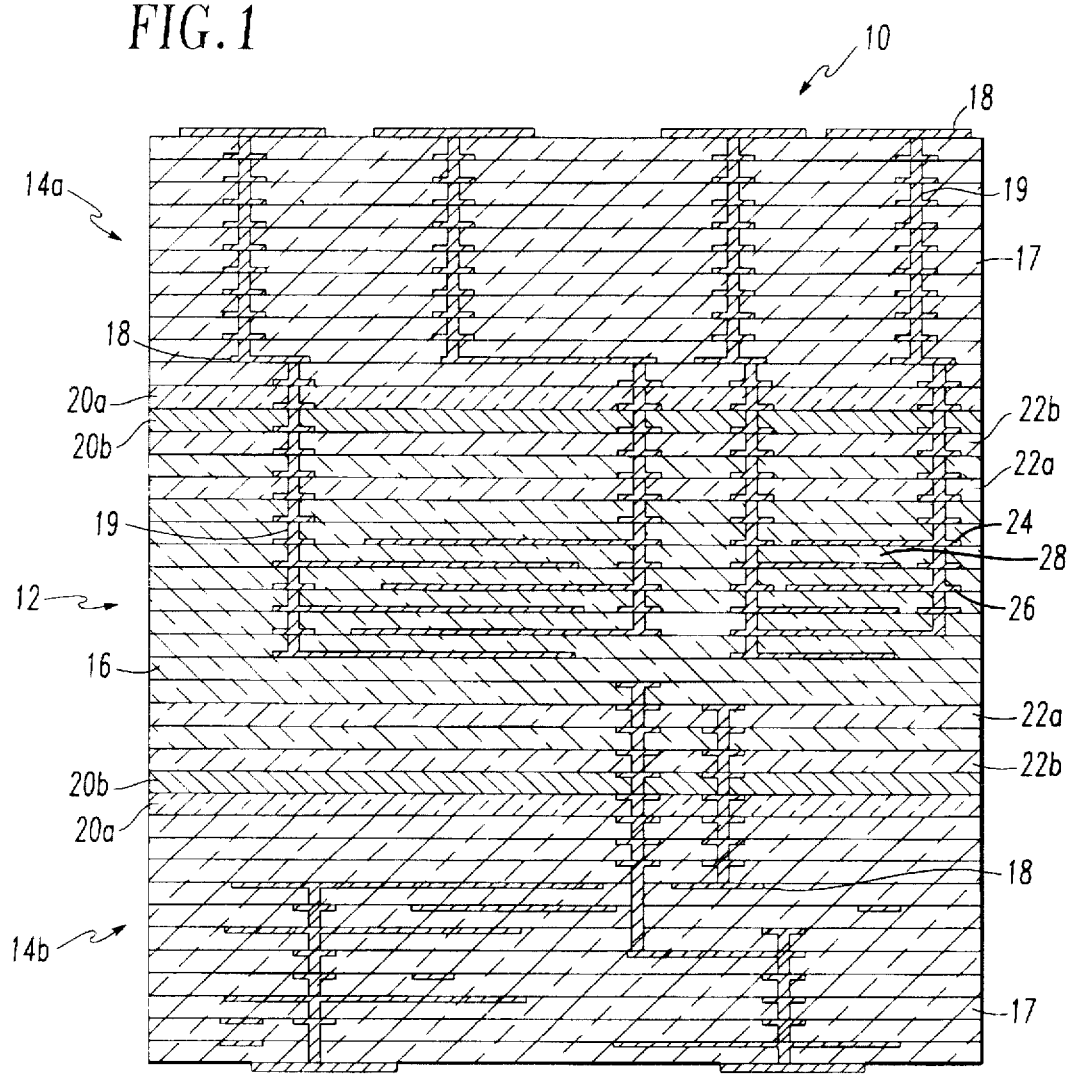
FIG. 1 is schematic section of a first embodiment of an electronic package in accordance with the present invention which includes a plurality of buffer layers.

The embodiment of the electronic package 10 in accordance with the present invention shown in FIG. 1 includes a passive component portion 12 and at least one signal processing portion 14. The passive component portion 12 may include a plurality of high K dielectric layers 16 and the signal processing portion 14 may include a plurality of low K dielectric layers 17 as shown.

Referring to FIG. 1, the electronic package 10 in accordance with the present invention preferably includes metallization patterns 18 between the high K dielectric layers 16 and the low K dielectric layers 17. The metallization patterns 18 are created by applying selected amounts of conductive metals in a selected pattern upon the high K dielectric layers 16 and low K dielectric layers 17.

The passive component portion 12 may include metallization patterns 18 to form buried passive components such as capacitors 28 within the electronic package 10. In particular, the metallization pattern 18 within the passive component portion 12 may include a first electrode 24 and an opposingly oriented second electrode 26. The high K dielectric and the first electrode 24 and second electrode 26 may form a capacitor 28. The signal processing portion 14 may include metallization patterns 18 between the low K dielectric layers 17 to form various signal processing devices such as transmit/receive (T/R) modules and the like.

A selected number of vias or holes may also be punched through the high K dielectric layers 16 and the low K dielectric layers 17. The vias may be openings through the layers 16, 17 and via conductors 19 may be placed within the vias to provide electrical connections between the layers 16, 17. In this way, signal processing devices and passive electrical components may be formed three dimensionally within and between the high K dielectric layers 16 and the low K dielectric layers 17 of the electronic package 10.

The metallization patterns 18 and via conductors 19 preferably include highly conductive materials such as gold, silver, copper and alloys thereof. However, some of these highly conductive materials have melting points of approximately 1060° C. Therefore, densification of the electronic packages 10 must be achieved at temperatures below the melting point of the particular conductive material forming the metallization pattern 18.

Therefore, the high K dielectric layers 16 within the passive component portion 16 are preferably lead-based relaxor dielectric layers. In particular, layers 16 of $Pb(Mg_{0.33},Nb_{0.67})O_3$ provide a high dielectric constant (K) from 15000–25000 and fire in the 850°– 1000° C. range. Providing high K dielectric layers 16 within the passive component portion 12 permits the formation of capacitors 28 having reduced sizes. Alternatively, other Pb-based perovskites such as Lead Zinc Niobate, Lead Iron Tungstate, Lead Iron Nobate and Lead Nickel Niobate may be substituted as the lead-based relaxor dielectric.

The layers 17 within the signal processing portion 14 preferably include borosilicate and a crystalline ceramic filler such as quartz. In particular, the layers 17 may include approximately 60% borosilicate but other ratios of boron, silica, and quartz may be utilized for the purposes of matching thermal expansion and/or densification behavior. Layers 17 of borosilicate and quartz provide a low K dielectric and low loss for fast signal processing with minimal attenuation of the signal. In addition, layers 17 which contain borosilicate and quartz may be fired at temperatures less than 1000° C. Methods of fabricating the low K dielectric layers 17 are disclosed in co-pending United States patent applications bearing Ser. No. 08/096, 235, filed Jul. 26, 1993, incorporated herein by reference and assigned to the assignee hereof, and Ser. No. 08/460,953, filed Jun. 5, 1995, incorporated herein by reference and assigned to the assignee hereof.

Preferably, the low K dielectric layers 17 have a dielectric constant of less than 4.0 to provide fast signal processing with minimal signal attenuation. The low K dielectric layers 17 described in the incorporated patents have a dielectric constant of approximately 3.8–4.0.

Referring to FIG. 1, the electronic package 10 in accordance with the present invention additionally includes at least one buffer layer 20. The buffer layers 20 are preferably tape formulations which include barium. Barium containing compositions with a characteristic densification behavior provide a level of suppression of undesirable chemical reactions sufficient to allow the fabrication of dielectric substrates with Pb-based perovskite capacitor dielectrics. In particular, the buffer layers 20 reduce chemical reactions which lead to the formation of undesirable pyrochlore phase once the high K dielectric layers 16 and the low K dielectric layers 17 are heated above 800° C.

The buffer layers 20 preferably contain barium in the form of BaO, $BaCO_3$ and $BaTiO_3$ and combinations thereof. The levels of barium are preferably between approximately 25–85% with the balance of the formulation consisting of glass, glass forming additives and inorganic fillers such as BaO, CaO, SrO, $La_2O_3$, $Ta_2O_5$, $TiO_2$, $ZrO2$, $SiO_2$, MgO, $Nb_2O_5$, $Al_2O_3$, $GeO_2$ and combinations thereof. The glass, glass forming additives and inorganic fillers control the shrinkage, shrinkage rate, thermal expansion and chemical compatibility of the buffer layer 20 in contact with either the Pb-based high K dielectric layers 16 of the passive component portion 12 or the low K dielectric layers 17 of the signal processing portion 14.

In addition, multiple buffer layers 20 may be provided to grade the chemical composition of the buffer region in order to optimize densification behavior while maintaining chemical stability of the high K dielectric layers 16 within the passive component portion 12 and the low K dielectric layers 17 within the signal processing portion 14.

The electronic packages 10 in accordance with the present invention may additionally include at least one thin buffer layer 22. Preferably, each thin buffer layer 22 is approximately less than or equal to approximately 0.001" thick. The thin buffer layers 22 preferably include approximately 85–100% $BaTiO_3$ and the balance consists of glass, glass forming additives and inorganic fillers such as BaO, CaO, SrO, $La_2O_3$, $Ta_2O_5$, $TiO_2$, $ZrO_2$, $SiO_2$, MgO, $Nb_2O_5$, $Al_2O_3$, $GeO_2$ and combinations thereof. The fillers are used to optimize densification during the latter stages of sintering.

The thin buffer layers 22 may be formulated to normally fire to full density discretely at 1300° C. However, the thin buffer layers 22 can be fully densified at lower temperatures when adjacent to or buried within the high K dielectric or the Ba-based buffer layers 20. In particular, the thickness of the thin buffer layers 22, diffusion of the Pb from adjacent layers and forces exerted by the densification of surrounding layers result in nearly full densification at approximately 980° C.

The thin buffer layers 22 provide an additional physical barrier during the initial stages of densification by creating a more difficult path for chemical diffusion. The thin buffer layers 22 also react with the diffusing species during the latter part of densification to lessen their interaction with the high K dielectric within the passive component portion 12.

The buffer layers 20, 22 may additionally include a plurality of vias as shown in FIG. 1 to accept the via conductors 19 which may electrically couple the passive component portion 12 and the signal processing portion 14.

The high K dielectric layers 16, low K dielectric layers 17, and the buffer layers 20, 22 may be fabricated by known methods in the art. In particular, powders making up the composition of a particular layer 16, 17, 20, 22 may be suspended in a solvent containing a dispersant to form a low viscosity (10–1000 cps) ceramic slip. The solvent and dispersant are dictated by the chemical nature of the powders and interaction between all of the components of the ceramic slip. Dispersion may be achieved by tumbling the powder solvent mixture in a container of ceramic milling media to break up powder agglomerates.

Solvents, such as alcohol (e.g., ethanol or propanol), and aromatic hydrocarbons including Toluene or Xylene, and milling media such as alumina or $ZrO_2$, and dispersants such as fish oil or Terigitol NP10 provided by Union Carbide, South Charleston, W. Va. may be utilized.

Preferably, a binder and plasticizer may be added to the slurry after a suitable period of dispersion (e.g., 10 Hours) and blending if more than one type of powder is being combined. The binders, polyvinyl butyral, such as B 78 or 98, provided by Monsanto located in St. Louis, Mo., hold the ceramic particles together after removing the solvent. The plasticizers, such as PX316 provided by USX Corporation located in Pittsburgh, Pa. and S 160 provided by Monsanto, impart a degree of plasticity to the powder-binder composite which allow it to be handled without crumbling or cracking. Next, the mixture is mixed for an additional period (e.g., more than 4 hours) to provide homogenous distribution of the binder and plasticizer amongst the ceramic particles.

The viscosity of the final mixture is adjusted to a range between 2,000 and 10,000 cps by the addition or removal of the solvent. The desired viscosity will depend upon the desired casting thickness and drying properties of the slip.

The slip may be cast onto a carrier film such as Mylar® once the viscosity has been adjusted. The casting is preferably performed with a doctor blade and the thickness of the tape may be adjusted by varying the gap between the doctor blade and the carrier film as well as the rate at which the carrier film passes by the doctor blade.

The slip may be dried on the carrier once it has been cast to produce a powder-binder composite thin tape layer 16, 17, 20, 22 having a preferably uniform thickness (e.g., 0.0005–0.050"). The thin tape layer 16, 17, 20, 22 can be removed from the carrier film and further processed.

The tape layers 16, 17, 20, 22 may be punched by an automated punching system to produce a plurality of vias or holes therethrough. The vias may be back filled with metallization in the form of a paste by screen printing to form via conductors 19 and interlayer metallization patterns 18 may be printed on the same layers 16, 17, 20, 22 through screen printing.

In particular, the tape layers 16, 17, 20, 22 may be stacked in the required sequence once the metallization paste has dried and subsequently laminated. The stack of tape layers 16, 17, 20, 22 may be laminated at a pressure of approximately 3000 PSI at 120° F.

The high K dielectric layers 16, low K dielectric layers 17 and buffer layers 20, 22 are preferably simultaneously co-fired to produce an electronic package 10 in accordance with the present invention. Only the metallization and ceramic remain after firing at temperatures between 950° C. and 1200° C. depending upon the specific conductor utilized. The product sinters to a monolithic high-density body after approximately 3 hours of firing.

The embodiment of the electronic package 10 shown in FIG. 1 is symmetrical inasmuch as it contains two signal processing portions 14a, 14b adjacent the passive component portion 12. In particular, the embodiment shown in FIG. 1 includes 11 layers (2 mils each) of the high K dielectric between 12 layers of the low K dielectric (~5 mils each) and the buffer layers 20, 22. Other electronic packages 10 may contain additional passive component portions 12 and signal processing portions 14 or a single passive component portion 12 adjacent a single signal processing portion 14. Furthermore, the number of high dieletric layers 16, low dielectric layers 17 and buffer layers 20, 22 may be varied.

Referring to FIG. 1, each signal processing portion 14 includes a plurality of low K dielectric layers 17 and the passive component portion 14 includes a plurality of high K dielectric layers 16. The electronic package 10 additionally includes two buffer layers 20 and two thin buffer layers 22.

The high K material may be a PMN-based formulation consisting of commercial $Pb(Mg_{0.33}Nb_{0.67})O_3$ powder from TAM Ceramics located in Niagara Falls, N.Y. The low K material may be a mixture including a quantity of borosilicate glass (e.g., 30%) and the balance may be a crystalline ceramic filler such as quartz.

As shown in FIG. 1, the first buffer 20a is adjacent the low K dielectric layers 17. The first buffer 20a may consist of a mixture of borosilicate glass, commercial $BaTiO_3$ and a crystallized BaTi-borosilicate. In particular, the first buffer 20a may contain 60–70% borosilicate glass, 5–15% commercial $BaTiO_3$ and 30–40%. crystallized BaTi borosilicate.

The second buffer 20b may consist of 50–75% $BaTiO_3$, amorphous $SiO_2$ and commercial glasses 7570 provided by Transelco Division, Ferro, located in Penn Yan, N.Y., and 7720 provided by Corning Glass in Corning, N.Y. Preferably, the second buffer layer 20b additionally includes Pb-glass which contributes to the densification behavior of the first buffer layer 20a and provides chemical stability in contact with the high K dielectric layers 16. The second buffer 20b may additionally include MgO which is beneficial to maintain the properties of the high K dielectric layers 16. The above constituents may be partly or completely reacted by milling and firing to obtain a frit.

The first buffer layer 20a preferably does not contain lead inasmuch as lead is detrimental to the properties of the low K dielectric layers 17. Furthermore, MgO is preferably not included within the first buffer layer 20a because MgO causes crystallization in contact with the low K dielectric layers 17 and halts densification.

The overall composition and composition of the constituents of the buffer layers 20, 22 are dictated by the nature of the chemical interactions between the buffer layers 20, 22 and the high K dielectric and low K dielectric and the densification behaviors of all tape layers 16, 17, 20, 22 within the electronic package 10.

The embodiment of the electronic package 10 shown in FIG. 1 additionally contains a first thin buffer layers 22a between the high K dielectric layers 16, and second thin buffer layers 22b adjacent the second buffer layers 20b.

The thin buffer layers 22 may include commercial $BaTiO_3$ powder from Transelco Division, Ferro; Lead Titanate from TAM Ceramics; and Pb Germanate glass as the inorganic constituents. The thin buffer layers 22 provide an additional physical barrier which limits interaction between the high K dielectric layers 16 and the low K dielectric layers 17.

FIG. 2–FIG. 6b show additional embodiments of the electronic package 10 in accordance with the present invention. Although not shown in FIG. 2–FIG. 6b, it is to be understood that the embodiments of the invention shown therein include metallization patterns 18 and via conductors 19 as shown in FIG. 1.

The specific selection of buffer layers 20, 22 is dependent upon specific densification, thermal expansion, chemical barrier requirements and potential passive device requirements for intermediate dielectrics. Each of the embodiments shown in FIG. 2–FIG. 6b includes a passive component portion 12 having a plurality of high dielectric layers 16 and a signal processing portion 14 having a plurality of low dielectric layers 17. Similar to FIG. 1, the electronic packages 10 shown in FIG. 2–FIG. 6b may also include additional buffer layers 20, 22 and low K dielectric layers 17 on the opposite side of the passive component portion 12 to create symmetrical electronic packages 10.

Figure 2:
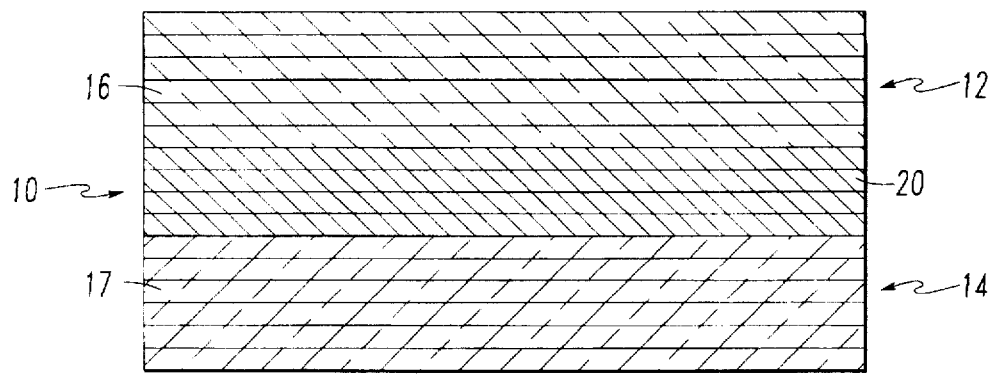
FIG. 2 is a schematic section of a second embodiment of the electronic package which includes a plurality of identical buffer layers.

The embodiment of the electronic package 10 shown in FIG. 2 includes barium buffer layers 20 to separate the passive component portion 12 and the signal processing portion 14.

Figure 3:
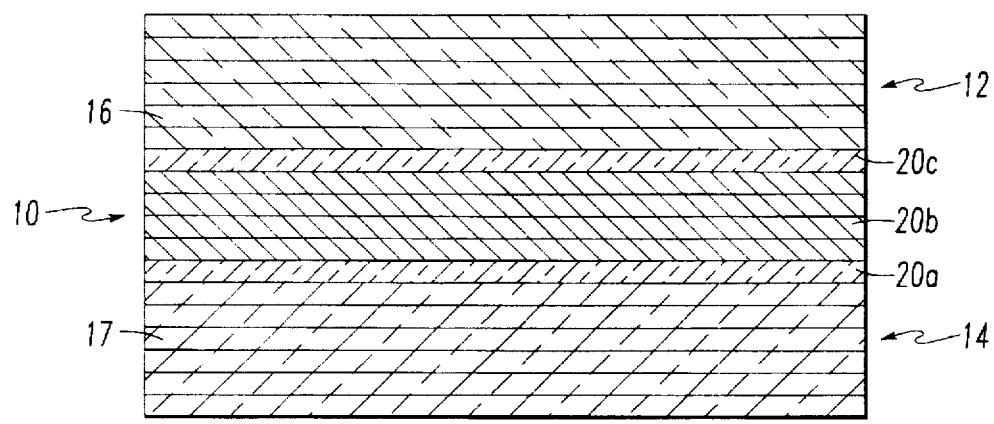
FIG. 3 is a schematic section of a third embodiment of the electronic package which includes buffer layers having different compositions.

The embodiment of the electronic package 10 shown in FIG. 3 includes a plurality of buffer layers 20a, 20b, 20c. A third buffer 20c may preferably include Pb-glass to provide chemical stability in contact with the high K dielectric layers 16, and MgO which is beneficial to maintain the properties of the high K dielectric layers 16.

Figure 4:
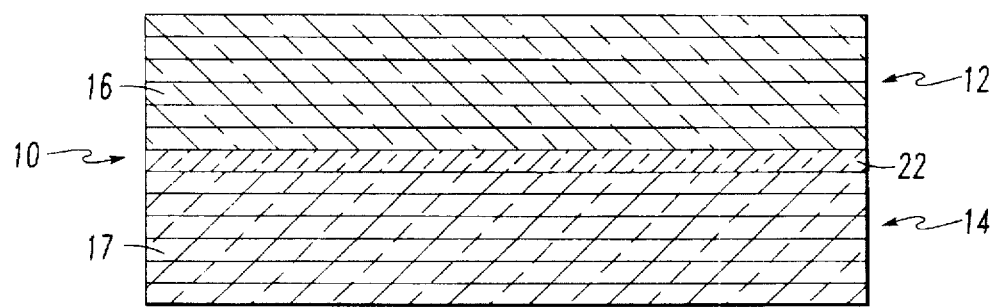
FIG. 4 is a schematic section of a fourth embodiment of the electronic package which includes a single thin buffer layer.

The embodiment of the electronic package 10 shown in FIG. 4 includes a single thin buffer layer 22 interposed between the passive component portion 12 and the signal processing portion 14.

Figure 5A:
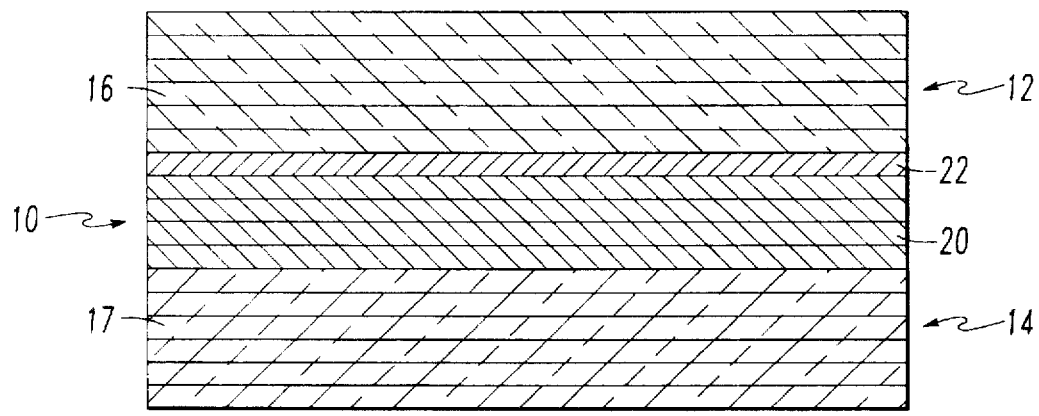
FIG. 5a and FIG. 5b are schematic sections of additional embodiments of the electronic package which include a plurality of buffer layers including a single thin buffer layer.
Figure 5B:
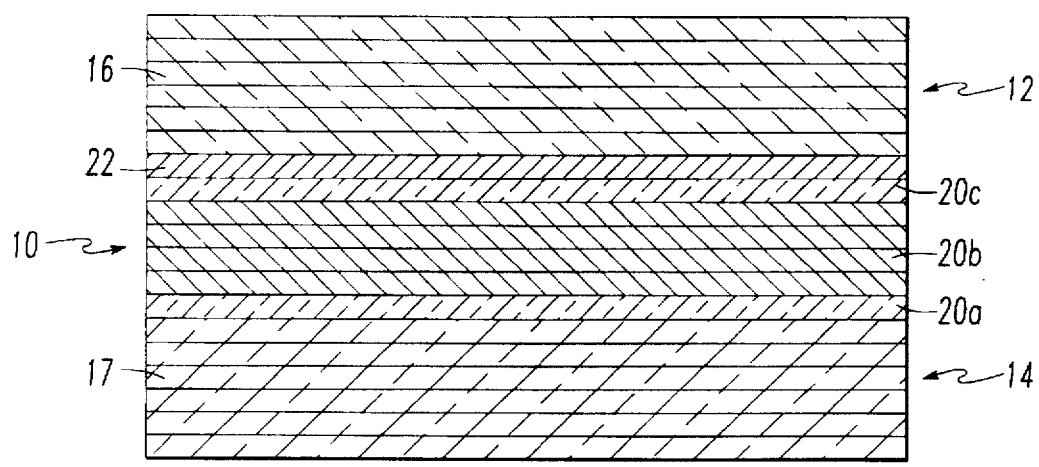

The electronic package 10 shown in FIG. 5a includes a thin buffer layer 22 and plurality of buffer layers 20 adjacent the passive component portion 12 and the signal processing portion 14, respectively. The electronic package 10 shown in FIG. 5b includes a thin buffer layer 22 adjacent the passive component portion 12. In addition, a plurality of buffer layers 20a, 20b, 20c are interposed between the thin buffer layer 22 and the signal processing portion 14.

Figure 6A:
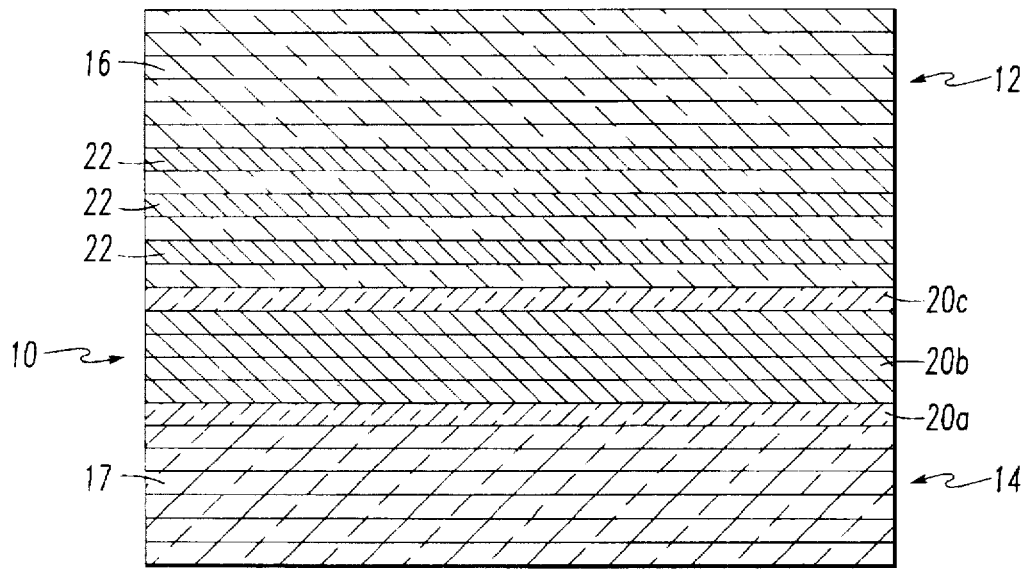
FIG. 6a and FIG. 6b are schematic sections of additional embodiments of the electronic package which include a plurality of buffer layers including multiple thin buffer layers.
Figure 6B:
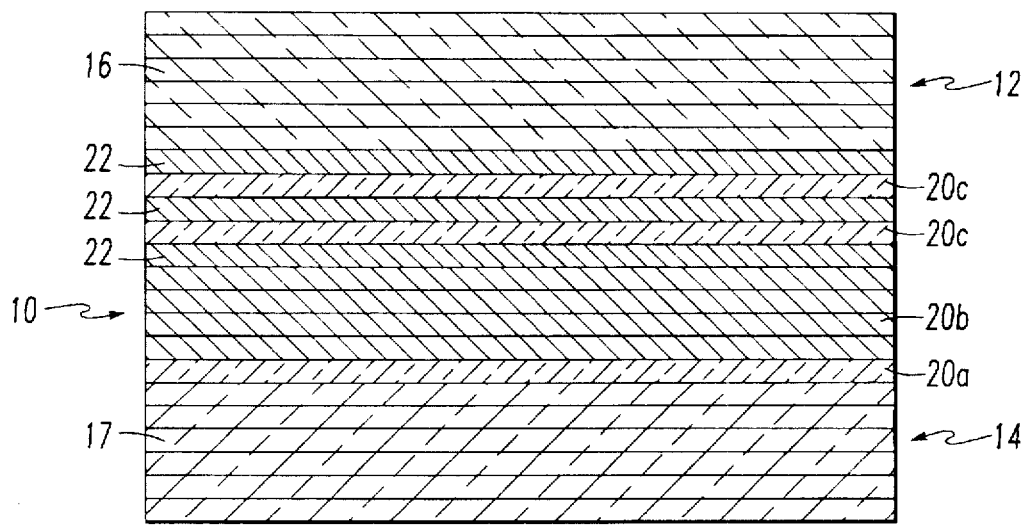

The electronic packages 10 shown in FIG. 6a and FIG. 6b include a plurality of buffer layers 20a, 20b, 20c interposed between the passive component portion 12 and the signal processing portion 14. The embodiment of the electronic package 10 shown in FIG. 6a additionally includes a plurality of thin buffer layers 22 intercalated between the high K dielectric layers 16 within the passive component portion 12. Furthermore, the electronic package 10 shown in FIG. 6b includes a plurality of thin buffer layers 22 positioned between the third buffer layers 20c.

While preferred embodiments of the invention have been shown and described herein, it will be appreciated by those skilled in the art that various modifications and alternatives to the disclosed embodiments may be developed in light of the overall teachings of the disclosure. Accordingly, the disclosed embodiments are meant to be illustrative only and not limiting to the scope of the invention which is to be given the full breadth of the following claims and all equivalents thereof.

We claim:

1. An electronic package having a buried passive component therein, comprising:
   a. a passive component portion including a plurality of layers of high K dielectric material;
   b. a signal processing portion including a plurality of layers of low K dielectric material;
   c. at least one buffer layer interposed between said passive component portion and said signal processing portion and said at least one buffer layer containing approximately 25 to 100% barium compound; and
   d. metallization printed upon at least one of the layers of high K dielectric material and at least one of the layers of low K dielectric material.

2. The electronic package of claim 1 wherein the barium compound within said at least one buffer layer is selected from the group consisting of BaO, $BaCO_3$, and $BaTiO_3$ and combinations thereof.

3. The electronic package of claim 1 further comprising via conductors through the buffer layers to electrically couple said passive component portion and said signal processing portion.

4. The electronic package of claim 3 wherein said metallization and said via conductors are selected from the group consisting of gold, silver, copper and alloys thereof.

5. The electronic package of claim 1 wherein said metallization includes a plurality of opposing electrodes within said passive component portion to form a capacitor.

6. The electronic package of claim 1 wherein the high K dielectric material is lead based.

7. The electronic package of claim 1 wherein the high K dielectric material is substantially $Pb(Mg_{0.33}Nb_{0.67})O_3$.

8. The electronic package of claim 1 wherein said at least one buffer layer includes a buffer layer having a barium compound content of approximately 50%.

9. The electronic package of claim 8 wherein said at least one buffer layer includes a thin buffer layer having a barium compound content of approximately 100%.

10. The electronic package of claim 1 wherein said at least one buffer layer includes a thin buffer layer having a barium compound content of approximately 100%.

11. The electronic package of claim 10 wherein the thin buffer layer is within said passive component portion.

12. The electronic package of claim 1 wherein each of said at least one buffer layer includes inorganic fillers.

13. The electronic package of claim 1 wherein the low K dielectric material includes borosilicate.

14. The electronic package of claim 13 wherein the low K dielectric material includes a crystalline ceramic filler.

15. The electronic package of claim 14 wherein the crystalline ceramic filler is quartz.

16. The electronic package of claim 3 wherein the barium compound within said at least one buffer layer is selected from the group consisting of BaO, $BaCO_3$, and $BaTiO_3$ and combinations thereof and said metallization and said via conductors are selected from the group consisting of gold, silver, copper and alloys thereof and the high K dielectric material is lead based and the low K dielectric material includes borosilicate.

17. An electronic package having a buried passive component therein, comprising:
   a. a passive component portion including a plurality of layers of high K dielectric material;
   b. a signal processing portion including a plurality of layers of low K dielectric material;
   c. at least one buffer layer interposed between said passive component portion and said signal processing portion; and
   d. metallization printed upon at least one of the layers of high K dielectric material and at least one of the layers of low K dielectric material;
   wherein the layers of high K dielectric material and the layers of low K dielectric material and said at least one buffer layers are co-fired at a temperature below approximately 1200° C. to form said electronic package.

18. The electronic package of claim 17 wherein each of said at least one buffer layer contains approximately 25 to 100% barium compound.

19. The electronic package of claim 18 wherein the barium compound within said at least one buffer layer is selected from the group consisting of BaO, BaCO$_3$, and BaTiO$_3$ and combinations thereof.

20. The electronic package of claim 17 further comprising via conductors through the buffer layers to electrically couple said passive component portion and said signal processing portion.

21. The electronic package of claim 20 wherein said metallization and said via conductors are selected from the group consisting of gold, silver, copper and alloys thereof.

22. The electronic package of claim 17 wherein said metallization includes a plurality of opposing electrodes within said passive component portion to form a capacitor.

23. The electronic package of claim 17 wherein the high K dielectric material is lead based.

24. The electronic package of claim 17 wherein the high K dielectric material is substantially Pb(Mg$_{0.33}$Nb$_{0.67}$)O$_3$.

25. The electronic package of claim 17 wherein said at least one buffer layer includes a buffer layer having a barium compound content of approximately 50%.

26. The electronic package of claim 25 wherein said at least one buffer layer includes a thin buffer layer having a barium compound content of approximately 100%.

27. The electronic package of claim 17 wherein said at least one buffer layer includes a thin buffer layer having a barium compound content of approximately 100%.

28. The electronic package of claim 27 wherein the thin buffer layer is within said passive component portion.

29. The electronic package of claim 17 wherein each of said at least one buffer layer includes inorganic fillers.

30. The electronic package of claim 17 wherein the low K dielectric material includes borosilicate.

31. The electronic package of claim 30 wherein the low K dielectric material includes a crystalline ceramic filler.

32. The electronic package of claim 31 wherein the crystalline ceramic filler is quartz.

33. The electronic package of claim 20 wherein each of said at least one buffer layer contains approximately 25 to 100% barium compound selected from the group consisting of BaO, BaCO$_3$, and BaTiO$_3$ and combinations thereof and said metallization and said via conductors are selected from the group consisting of gold, silver, copper and alloys thereof and the high K dielectric material is lead based and the low K dielectric material includes borosilicate.

* * * * *